United States Patent [19]
Knödgen

[11] Patent Number: 6,114,883
[45] Date of Patent: Sep. 5, 2000

[54] CIRCUIT FOR DRIVING SEMICONDUCTOR SWITCHES

[75] Inventor: Horst Knödgen, München, Germany

[73] Assignee: Dialog Semiconductor GmbH, Kirchheim, Germany

[21] Appl. No.: 09/113,922

[22] Filed: Jul. 14, 1998

[30] Foreign Application Priority Data

Jul. 15, 1997 [DE] Germany ............................ 197 30 215

[51] Int. Cl.[7] .................................................. H03B 1/00
[52] U.S. Cl. ........................................... 327/108; 327/112
[58] Field of Search .................................... 327/108, 109, 327/110, 111, 112

[56] References Cited

U.S. PATENT DOCUMENTS

| | | | |
|---|---|---|---|
| 5,543,740 | 8/1996 | Wong | 327/108 |
| 5,719,521 | 2/1998 | Wong | 327/434 |
| 5,742,196 | 4/1998 | Fronen et al. | 327/382 |
| 5,754,065 | 5/1998 | Wong | 327/108 |
| 5,796,277 | 8/1998 | Kim et al. | 327/108 |

FOREIGN PATENT DOCUMENTS 8-103 087  4/1996  Japan .

Primary Examiner—Timothy P. Callahan
Assistant Examiner—Hai L. Nguyen
Attorney, Agent, or Firm—Henry M. Feiereisen

[57] ABSTRACT

A circuit includes a first control unit which controls a first semiconductor switch connecting an output of the circuit to a first supply voltage terminal and a second control unit which controls a second semiconductor switch connecting the output of the circuit to a second supply voltage terminal. A single operating voltage source supplies a voltage to the first control unit, whereas a rechargeable energy storage device supplies a voltage to the second control unit. One terminal of the operating voltage source is connected to the first supply voltage terminal and one terminal of the energy storage device is connected to the output of the circuit. The first control unit and the second control unit are connected with each other via a switching device which is switched by the first control unit and which transmits, preferably when the first semiconductor switch is closed and the second semiconductor switch is open, a current for charging the energy storage device and for transmitting control information from the first control unit to the second control unit.

10 Claims, 2 Drawing Sheets

CIRCUIT FOR DRIVING SEMICONDUCTOR SWITCHES

BACKGROUND OF THE INVENTION

The present invention generally relates to a driver circuit for semiconductor switches, and more particularly to a driver circuit for high voltage applications, of a type including first and second control units which alternately control respective first and second semiconductor switches to alternately connect the output of the circuit to respective first and second supply voltage terminals.

A circuit of this type is described, for example, in DE 34 15 011 A1 and includes two semiconductor switches which are implemented as MOS transistors in a half-bridge configuration. Each of the semiconductor switches connects a respective terminal of a power supply to an output of a circuit. A control unit controls the semiconductor switches with opposite phases, i.e. in a push-pull configuration.

This circuit has the disadvantage that the control units require control signals of different voltage levels which are difficult to generate with low-cost switching means, in particular at high supply voltages.

SUMMARY OF THE INVENTION

It is thus an object of the present invention to provide an improved circuit, obviating the afore-stated drawbacks.

In particular, it is an object of the present invention to provide an improved circuit with control units which can be integrated and controlled with simple circuitry and which can be still be operated reliably at high supply voltages.

These objects, and others which will become apparent hereinafter, are attained in accordance with the present invention by providing a first control unit receiving an operating voltage from a power supply, whereas a rechargeable energy storage device—preferably a capacitor—supplies a voltage to the second control unit. The operating voltage supply is here connected to the first control unit whereas the energy storage device is connected to the second control unit. One terminal of the operating voltage supply is also connected to the first supply voltage terminal while one terminal of the energy storage device is connected to the output of the circuit. The output of the circuit operates as a reference potential for the second control unit, supplying a floating reference potential. To charge the energy storage device and to transfer control information from the first control unit to the second control unit, the first control unit provides a current which is supplied to the second control unit via a switching element, preferably a diode, which connects the control units with each other. The first control unit is adapted to switch the switching element on and off can, preferably during the time when the first semiconductor switch is closed and the second semiconductor switch is open. Conversely, the switching element is open when the first semiconductor switch is open and the second semiconductor switch is closed, thereby dc-insulating the control units from each other.

Advantageously, the current flowing though the switching element is composed of two partial currents which are sequentially supplied by the first control unit, i.e. a charging current for charging the energy storage device and a signal current for transmitting the control information. The current is processed in the second control unit based on the signal form determined by the first control unit, such as the amplitude of the current or the preset sequence of the signal edges, and identified either as the charging current or as the signal current.

The circuit of the invention combines the following advantages:

The circuit is easy and inexpensive to manufacture and can be used in a variety of applications as driver for semiconductor switches in half-bridge circuits, such as, for example, as electronic ballast for halogen lamps and fluorescent lamps, in dc-dc converters or in motor controls.

The semiconductor switches can be transistors, in particular power transistors, preferably field effect transistors or IGB (Insulated Gate Bipolar) transistors.

When operating at a high supply voltage between the supply voltage terminals, only the semiconductor switches and the switching element have to have a high breakdown voltage.

Each of the control units can be integrated by conventional processes on a separate semiconductor chip or both control units can be integrated on common semiconductor chip. If the control units are integrated on separate semiconductor chips, the semiconductor chips can, for example, be mounted with an insulating adhesive on a common support and encapsulated in a common housing.

BRIEF DESCRIPTION OF THE DRAWING

The above and other objects, features and advantages of the present invention will now be described in more detail with reference to the accompanying drawing in which.

DETAILED DESCRIPTION OF PREFERRED EMBODIMENTS

Figure 1:
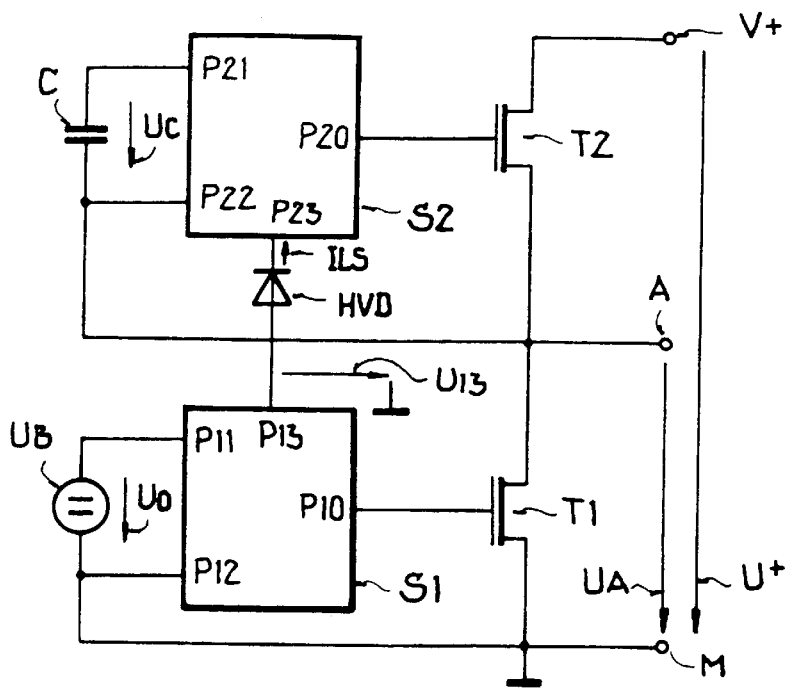
FIG. 1 shows a schematic circuit diagram of a circuit according to the present invention.

Throughout all the Figures, same or corresponding elements are generally indicated by same reference numerals.

Turning now to the drawing, and in particular to FIG. 1, there is shown a schematic circuit diagram of a circuit according to the present invention, including control units S1, S2 which are each integrated on a respective semiconductor chip and have two control terminals referred to as terminals P10, P13 and P20, P23, respectively, and two supply voltage terminals referred to as terminals P11, P12 and P21, P22, respectively, to which a voltage supply (not shown) is connected. The first control unit S1 operates as a master unit while the second control units S2 operates as a slave unit controlled by the master unit. An operating voltage source UB which supplies an operating voltage of, for example, 10 volts, is connected to the terminals P11 and P12 of the first control unit S1, whereas the energy storage device C which in the present example is in the form of a capacitor, is connected to the terminals P21 and P22 of the second control unit S2. The terminal P12 is also connected to the first supply voltage terminal M which can be a ground connection, while the terminal P22 is connected to the output A of the circuit.

In the present example, the semiconductor switches T1, T2 are n-channel MOS power transistors, but the switches T1, T2 can also be bipolar transistors. The gate of the first transistor T1 is connected to the terminal P10 of the first control unit S1, the drain of the first transistor T1 is connected to the output A of the circuit, and the source of the first transistor T1 is connected to the first supply voltage terminal M. The gate of the second transistor T2 is connected to the terminal P20 of the second control unit S2, the drain of the second transistor T2 is connected to the second supply voltage terminal V+, and the source of the second transistor T2 is connected to the output A of the circuit. The supply voltage U+ of, for example, 400 volts is applied between the supply voltage terminals V+ and M. The output voltage UA is then supplied between the output A of the circuit and the first supply voltage terminal M. The output voltage UA is the applied to a load (not shown) to be connected to the circuit terminal A.

The control units S1, S2 control the semiconductor switches T1, T2 in such a way that both switches T1, T2 are never closed at the same time, i.e. the switches T1, T2 are either alternatingly opened and closed in a push-pull mode, or both switches T1, T2 are opened simultaneously to deactivate the circuit. The control units S1, S2 therefore have to be synchronized with respect to each other. Synchronization is accomplished through the switching element which is implemented in form of a diode HVD and is connected on the anode side to terminal P13 and on the cathode side to terminal P23. As a result of the high supply voltage V+, the diode HVD is constructed as a high voltage diode, i.e. as a diode with a high reverse breakdown voltage.

When the first semiconductor switch T1 is closed and the second semiconductor switch T2 is open, the output voltage UA has a smallest value of approximately 0 volts. When the first semiconductor switch T1 is open and the second semiconductor switch T2 is closed, the output voltage UA has a maximum value which is approximately equal to the supply voltage U+. In the latter case, the voltage potentials at all terminals P20 . . . P23 of the second control unit S2 are the substantially higher than the voltage potentials at the terminals P10 . . . P13 of the first control unit S1, so that the diode HVD is biased in the reverse direction. The control units S1, S2 are then dc-decoupled from each other. When the output voltage UA is a minimum, the diode HVD can be biased in the forward direction by the control voltage U13 supplied to terminal P13 by the first control unit S1, thereby transmitting the current ILS from the first control unit S1 to the second control unit S2. The current ILS charges the capacitor C and transmits control information from the first control unit to the second control unit about the timing for switching the second semiconductor switch T2. The current ILS is composed of two partial currents which are alternately supplied by the first control unit S1 at terminal P13 when the output voltage UA is at the minimum, namely the charging current IL for charging the capacitor C and the signal current IS containing the control information. The second control unit S2 is adapted to unambiguously identify the charging current IL and the signal current IS according to a predetermined criteria, for example based on the respective amplitude or the established preset time sequence of the signal flanks of the respective charging current IL and signal current IS.

Figure 2:
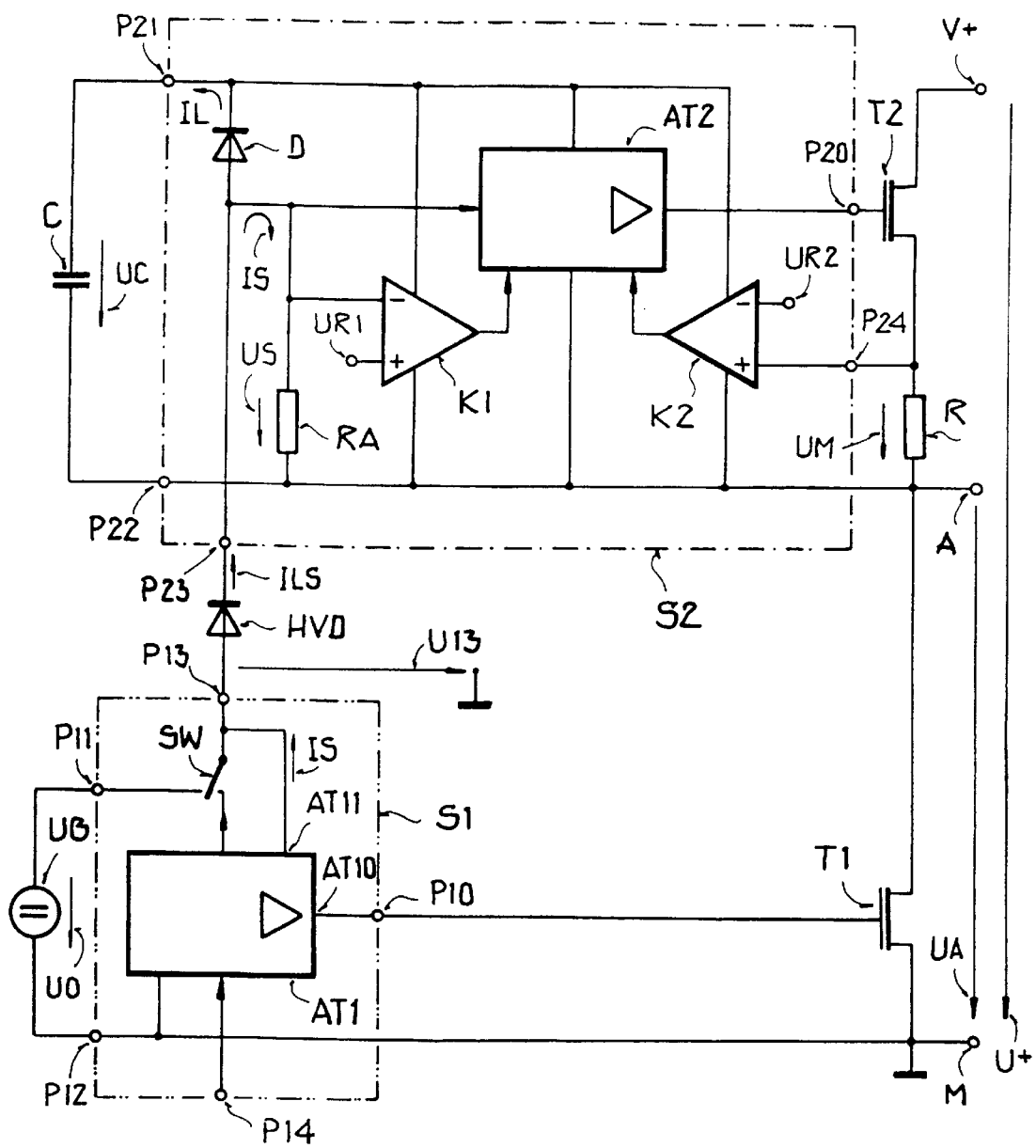
FIG. 2 is the circuit diagram of FIG. 1 in greater detail.

In the embodiment of FIG. 2, the charging current IL and the signal current IS are identified based on their respective amplitude. In this embodiment, the first control unit S1 includes an evaluation/driver unit AT1 which is powered by the operating voltage source UB and controls the first transistor T1 via a driver output AT1O connected to terminal P10. The evaluation/driver unit AT1 receives system information for controlling the transistors T1, T2 via an additional terminal P14 or via a data bus. The first control unit S1 further includes a switch SW which is controlled by the evaluation/driver unit AT1 and connects the terminal P13 to terminal P11. The terminal P13 is also connected to a current output AT11 of the evaluation/driver unit AT1, with the current output AT11 supplying the signal current IS.

The second control unit S2 includes an isolation diode D, a bleeder resistor RA, two comparators K1, K2 and an evaluation/driver unit AT2. The terminal P23 is here connected to terminal P21 via the isolation diode D and to terminal P22 via the bleeder resistor RA. The supply voltage for the comparators K1, K2 and the evaluation/driver unit AT24 is the voltage UC stored in capacitor C. The evaluation/driver unit AT2 is controlled via the terminal P23 and also by the comparators K1, K2 and in turn controls the second transistor T2 via terminal P20.

Figure 3:
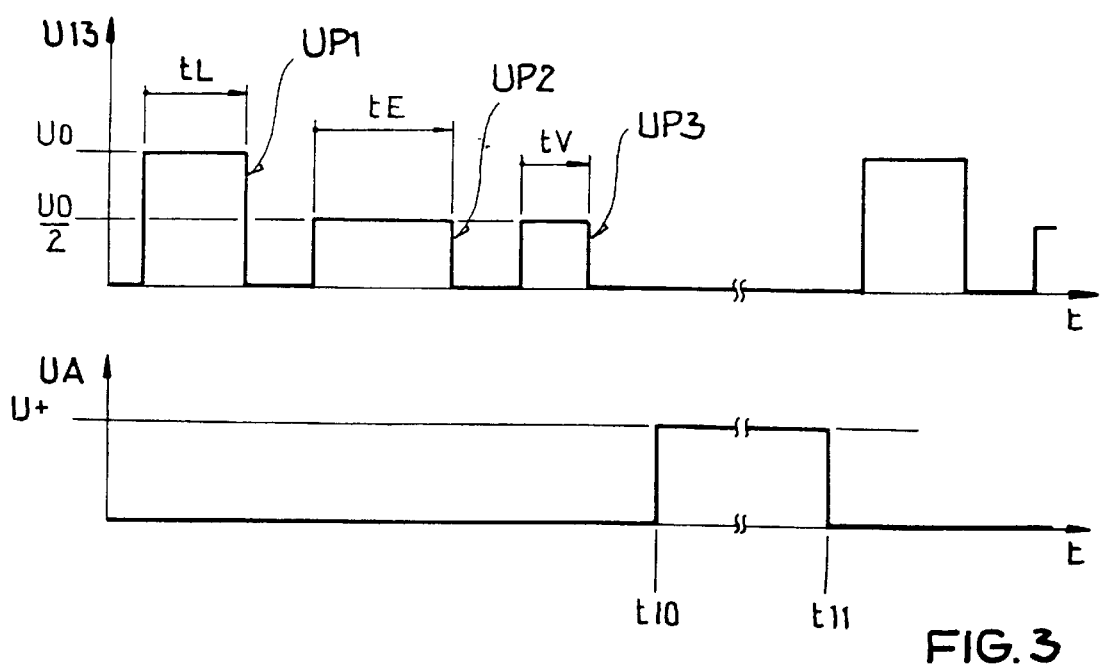
FIG. 3 are timing diagrams for different signals of the circuit of FIG. 2.

The first control unit S1 supplies at terminal P13 the control voltage U13 which—according to FIG. 3—during the time when the first semiconductor switch T1 is closed and the second semiconductor switch is open and the output voltage UA is therefore approximately zero, has a first voltage pulse UP1 of width tL, a second voltage pulse UP2 of width tE and a third voltage pulse UP3 of width tV. The pulse width tL is here the charging time for charging the capacitor C; the pulse width tV defines the delay time from a specified trigger event, for example the falling signal edge of the voltage pulse UP3, until the time t10 when the second semiconductor switch T2 is turned on; and the pulse width tE defines the time t10–t11 during which the second semiconductor switch T2 is turned on.

To generate the first voltage pulse UP1, the switch SW is closed for a time tL while the first transistor T1 is conducting and the second transistor T2 is blocking, whereby the operating voltage UO is applied to terminal P13. The amplitude of the voltage pules UP1 is a large enough to bias the diodes HVD and D in forward direction, thereby closing a current loop from the operating voltage source UB via the switch SW, the diodes HVD and D, the capacitor C, the first transistor T1 and back to the operating voltage source UB. The charging current IL charging the capacitor C flows through this current loop. After the switch SW is opened, while the first transistor T1 is still conducting and the second transistor T2 is still blocking, the terminal P13 receives via the current output AT11 of the processing/driver unit AT1 first the second voltage pulse UP2 and subsequently the third voltage pulse UP3. The voltage pulses UP2, UP3 have smaller amplitudes—for example by a factor 2—than the first voltage pulse UP1. Although the amplitudes of voltage pulses UP2, UP3 are sufficient to forward-bias the diode HVD, they are too small to also forward-bias the isolation diode D because capacitor C is already charged. Consequently, the signal current IS supplied by the voltage pulses UP2, UP3 drains from the processing/driver unit AT1 to the first supply voltage terminal M via the diode HVD, the bleeder resistor RA and the first transistor T1. The first comparator K1 compares the voltage drop US across the bleeder resistor RA with a first reference voltage UR1 generated in the second control unit S2. Based on the results of this comparison, the processing/driver unit AT2 recognizes if the charging current IL or the signal current IS is present at terminal P23. The voltage pulses UP2, UP3 are therefore unambiguously associated with the signal current IL and the pulse widths tE and tV of the respective voltage pulses UP2, UP3 evaluated to determine the switching times t10, t11 of the second transistor T2.

The second transistor T2 is connected to the output A of the circuit via a resistor R. The voltage UM which drops across resistor R is a measure for the current flowing through the second transistor T2 and is supplied to the second comparator K2 via the terminal P24. To protect the second transistor T2 from excessively large currents, the processing/ driver unit AT2 turns off the transistor T2 as soon as the voltage UM exceeds a second reference voltage UR2 generated in the second control unit S2.

Into the present embodiment, the pulse width of the signal current IS is modulated to transmit the control information. However, it would also be possible to transmit the control information in digital form. Moreover, voltage pulses of equal amplitude can be provided at terminal P13. These voltage pulses can then be unambiguously associated with the charging current IL or the signal current IS, for example, via the preset sequence of their signal edges. It is also possible to design circuits wherein the signal current IS is supplied to the capacitor C in the second control unit S2, so that the signal current IS operates simultaneously as the charging current IL.

While the invention has been illustrated and described as embodied in a circuit for driving semiconductor switches, it is not intended to be limited to the details shown since various modifications and structural changes may be made without departing in any way from the spirit of the present invention.

What is claimed as new and desired to be protected by Letters Patent is set forth in the appended claims:

What is claimed is:

1. A circuit comprising:
    a first control unit which controls a first semiconductor switch connecting an output of the circuit to a first supply voltage terminal;
    a second control unit which controls a second semiconductor switch connecting the output of the circuit to a second supply voltage terminal;
    a single operating voltage source which supplies a first voltage to the first control unit;
    a rechargeable energy storage device which supplies a second voltage to the second control unit;
    a switching device connecting the first control unit to the second control unit;
    wherein a terminal of the operating voltage source is connected to the first supply voltage terminal and a terminal of the energy storage device is connected to the output of the circuit, and wherein the switching device is switched by the first control unit and transmits a current from the first control unit to the second control unit, the current charging the energy storage device and transmitting control information.

2. The circuit of claim 1, wherein the first control unit defines a signal form of the current flowing through the switching device and wherein the second control unit identifies the signal form of the current so as to determine if the current is intended to charge the energy storage device or to transmit the control information.

3. The circuit of claim 1, wherein the switching device can be switched only when the first semiconductor switch is closed and the second semiconductor switch is open, and wherein a blocking potential is applied to the switching device when the first semiconductor switch is open and the second semiconductor switch is closed.

4. The circuit of claim 1, wherein the switching device is a diode.

5. The circuit of claim 1, wherein the semiconductor switches are transistors.

6. The circuit of claim 5, wherein the transistors are field-effect transistors.

7. The circuit of claim 1, wherein a high supply voltage is applied between the supply voltage terminals and wherein the switching device and the semiconductor switches have a high breakdown voltage.

8. The circuit of claim 1, wherein the energy storage device is a capacitor.

9. The circuit of claim 7, wherein the supply voltage is at least 400 volts.

10. The circuit of claim 7, wherein the breakdown voltage is at least as high as the supply voltage.

* * * * *